United States Patent
Kawasaki et al.

(10) Patent No.: US 7,214,595 B2
(45) Date of Patent: May 8, 2007

(54) METHOD OF PRODUCING SEMICONDUCTOR DEVICES

(75) Inventors: Atsuko Kawasaki, Yokohama (JP);
Satoshi Matsuda, Yokohama (JP);
Hisakazu Matsumori, Yokohama (JP);
Hidenori Shibata, Kitakyushu (JP);
Kumi Okuwada, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/607,216

(22) Filed: Jun. 27, 2003

(65) Prior Publication Data

US 2004/0266131 A1    Dec. 30, 2004

(51) Int. Cl.
*H01L 21/76* (2006.01)

(52) U.S. Cl. ............... 438/424; 438/400; 438/430; 438/431; 438/435; 438/437; 438/787; 257/E21.546

(58) Field of Classification Search ................ 438/770, 438/781, 789, 790, 430–431, 400, 787, 424
See application file for complete search history.

(56) References Cited

U.S. PATENT DOCUMENTS

| | | | |
|---|---|---|---|
| 6,191,002 B1 | 2/2001 | Koyanagi | |
| 6,566,229 B2* | 5/2003 | Hong et al. | 438/435 |
| 6,596,607 B2* | 7/2003 | Ahn | 438/424 |
| 6,699,799 B2* | 3/2004 | Ahn et al. | 438/781 |
| 2002/0168873 A1* | 11/2002 | Ahn et al. | 438/781 |
| 2003/0022522 A1* | 1/2003 | Nishiyama et al. | 438/762 |
| 2004/0106292 A1* | 6/2004 | Sato et al. | 438/689 |

FOREIGN PATENT DOCUMENTS

| | | |
|---|---|---|
| JP | 9-205140 | 8/1997 |
| JP | 11-307626 | 11/1999 |

OTHER PUBLICATIONS

Decision of Rejection issued by the Japanese Patent Office mailed Feb. 28, 2006, for Japanese Application No. 2002-056799, and English-language translation thereof.
Notification of Reasons for Rejection issued by the Japanese Patent Office mailed Nov. 16, 2004, for Japanese Application No. 2002-056799, and English-language translation thereof.

* cited by examiner

*Primary Examiner*—Jerome Jackson
*Assistant Examiner*—José R. Diaz
(74) *Attorney, Agent, or Firm*—Finnegan, Henderson, Farabow, Garrett & Dunner, L.L.P.

(57) ABSTRACT

A method of producing semiconductor devices is provided, which makes it possible to bury a silicon oxide without shape deterioration in device isolation trenches. The method comprises the steps of: forming an etching resistive mask over a semiconductor substrate; etching the semiconductor substrate through an opening in the etching resistive mask to form a device isolation trench; forming a coat of a silazane perhydride polymer solution over the semiconductor substrate having the device isolation trench formed therein; vaporizing a solvent from the coat and then subjecting the coat to chemical reaction to form a film of silicon oxide; removing said film of the silicon oxide leaving a residue inside said device isolation trench; and heating said silicon oxide left in said device isolation trench for densification.

4 Claims, 6 Drawing Sheets

(PRIOR ART)

FIG. 15

(PRIOR ART)

FIG. 16

METHOD OF PRODUCING SEMICONDUCTOR DEVICES

BACKGROUND OF THE INVENTION

1. Field of the Invention

The present invention relates to a method of producing semiconductor devices, in particular to a method of forming device isolation structures.

2. Description of the Related Art

Recently, STI (Shallow Trench Isolation) is widely employed for device isolation in a semiconductor device. This is a method of forming a trench in a device isolation region on a semiconductor substrate and burying a device isolation insulator film such as a silicon oxide film in this trench. For burying in the device isolation trench, a film of silicon oxide formed by the high-density plasma CVD (HDP) is commonly employed because it can be buried excellently. When the device isolation trench has a size of 0.1 µm or below as a result of progress in technology of miniaturization, it is difficult to bury the trench sufficiently even with HDP method.

To the contrary, as a trench burying method that does not depend on HDP, there is another method that employs a coat. For example, there is a proposed STI trench burying method that employs a solution of a silazane perhydride polymer (see Japanese Patent 3,178,412 and U.S. Pat. No. 6,191,002). This method includes coating the silazane perhydride polymer solution over a semiconductor substrate that has device isolation trenches formed therein; modifying the coat into a silicon oxide through chemical reaction; performing densification; and removing undesired portions to bury the silicon oxide in the trenches.

Specifically, the chemical reaction in the coat of the silazane perhydride polymer solution is performed by heating in a water vapor ambient, after vaporizing a solvent from the coat. During the heating, the silazane perhydride polymer [$(SiH_2NH)_n$] reacts with oxygen resulted from decomposition of the water vapor, gets denatured into the silicon oxide, and produces ammonia. The silicon oxide is then subjected to heating in an inert ambient at 700–100° C. to remove impurities such as ammonia and water for densification.

This method can be applied to burying in a fine device isolation trench with a width of about 0.1 µm. More specifically, (a) the silicon oxide can be buried without generation of voids. In addition, (b) no crack arises because modification from the silazane perhydride polymer into the silicon oxide causes no volume shrink. Alternatively, (c) the silicon oxide to be buried has a high etching resistance that causes no recess during useless etching in the step of wet etching of silicon nitride, for example.

The device isolation trench burying method using the silazane perhydride polymer can be hopefully applied to further fine-patterned LSI (Large Scale Integrated circuits). According to the studies by the Inventors et al., however, there are problems remained to be solved. One of them is a variation caused, corresponding to the width of the trench, in resistance against the wet etching of the silicon oxide buried in the device isolation trench.

Specifically, at a portion where the device isolation trench is narrower in width, an etching rate cannot be reduced sufficiently in the wet etching of the buried silicon oxide. As a result, a surface height of the silicon oxide is lowered compared to a portion where the trench is wider in width. Therefore, the silicon oxide with a uniform thickness cannot be buried in device isolation trenches with various widths.

Another problem is a low wet etching resistance at a portion where the silicon oxide formed by chemical reaction contacts the silicon nitride. The silicon nitride is employed as a mask for forming device isolation trenches and then held until the silicon oxide is buried in the trenches. The coat of the silazane perhydride polymer solution is modified into the silicon oxide through the chemical reaction, then the densified silicon oxide is buried in the trench through CMP (Chemical Mechanical Polishing) process. There are additional steps of removing the silicon nitride using a phosphoric acid and removing the silicon oxide using a buffer hydrofluoric acid. In the step of wet etching using the buffer hydrofluoric acid, the silicon oxide buried in the trench at a portion adjacent to the silicon nitride has a high etching rate, which causes a recess at the boundary around the device isolation region.

Figure 15:
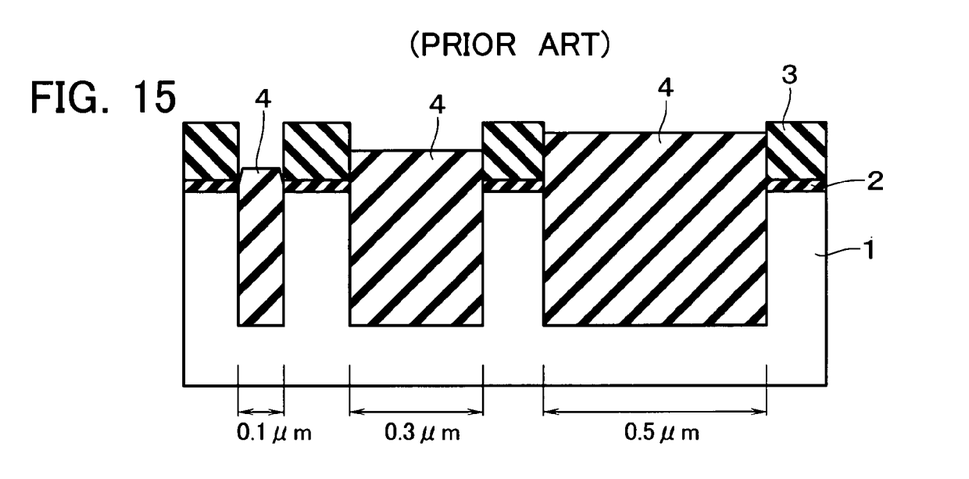
FIG. 15 is a cross-sectional view showing the device isolation trench filled by the conventional method.

FIG. 15 specifically shows a film of silicon oxide 4 buried in device isolation trenches with different widths by the above-described conventional method. The silicon oxide 4 is obtained through densification at 900° C. or below after reaction. In a state shown in FIG. 15, the silicon oxide 4 is densified, then planarized by removing undesired portions using CMP process, and etched using the buffer hydrofluoric acid. As shown, the height of the buried silicon oxide 4 varies depending on the width of the device isolation trench. The device isolation trench with a width as narrow as 0.1 µm causes a recess at a portion of the silicon oxide 4 adjacent to a film of silicon nitride 3 because the portion is etched greatly.

The present invention has an object to provide a method of producing semiconductor devices, which makes it possible to bury a silicon oxide without shape deterioration in device isolation trenches.

SUMMARY OF THE INVENTION

A method of producing semiconductor devices according to the present invention comprises the steps of: forming an etching resistive mask over a semiconductor substrate; etching the semiconductor substrate through an opening in the etching resistive mask to form a device isolation trench; forming a coat of a silazane perhydride polymer solution over the semiconductor substrate having the device isolation trench formed therein; vaporizing a solvent from the coat and then subjecting the coat to chemical reaction to form a film of silicon oxide; removing said film of the silicon oxide leaving a residue inside said device isolation trench; and heating said silicon oxide left in said device isolation trench for densification.

According to the present invention, the densification of the silicon oxide obtained through the chemical reaction of the silazane perhydride polymer solution is performed after the step of removing the silicon oxide except in the device isolation trench. Therefore, the silicon oxide excellent in etching resistance can be buried without shape deterioration even in a narrow device isolation trench.

BRIEF DESCRIPTION OF THE DRAWINGS

The present invention will be more fully understood from the following detailed description with reference to the accompanying drawings, in which.

DETAILED DESCRIPTION OF THE PREFERRED EMBODIMENTS

Embodiments of the present invention will be described below with reference to the drawings.

First Embodiment

Figure 1:
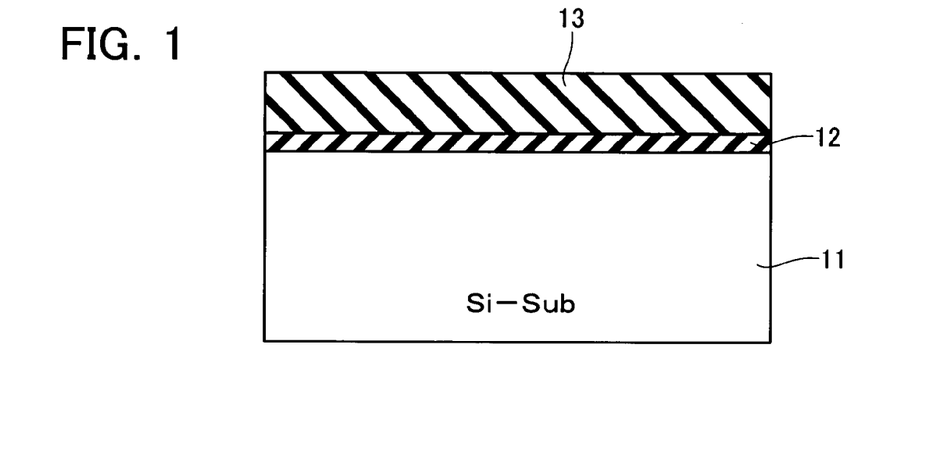
FIG. 1 is a cross-sectional view showing the step of depositing a film of silicon nitride according to an embodiment of the present invention.

FIGS. 1–8 show steps of device isolation in a semiconductor device according to an embodiment. As shown in FIG. 1, over the surface of a silicon substrate 11, a film of silicon oxide 12 is formed with a thickness of about 5 nm using thermal oxidation. Then, over the silicon oxide 12, a film of silicon nitride 13 is deposited with a thickness of about 200 nm using low pressure CVD (Chemical Vapor Deposition).

Figure 2:
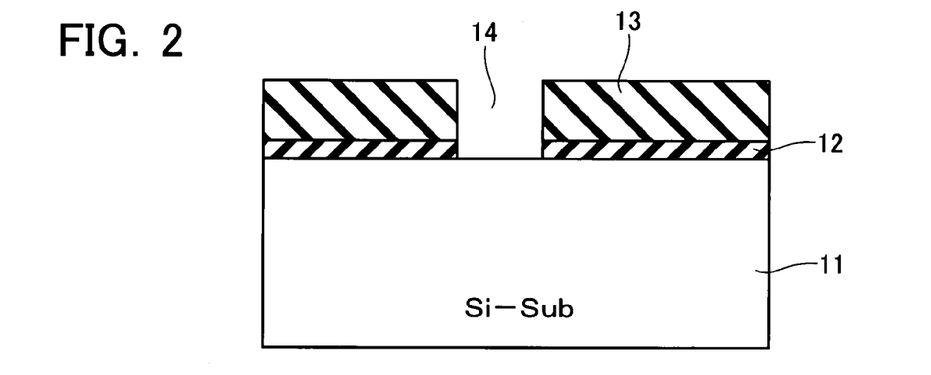
FIG. 2 is a cross-sectional view showing the step of etching the silicon nitride in the same embodiment.
Figure 3:
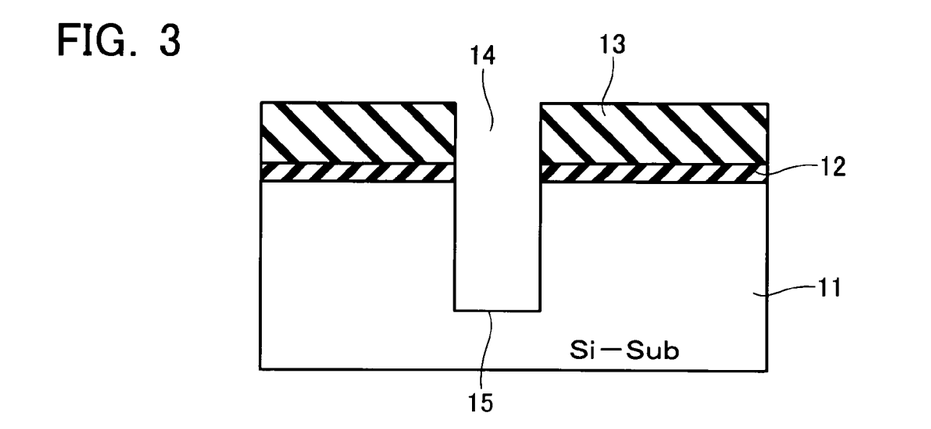
FIG. 3 is a cross-sectional view showing the step of etching a device isolation trench in the same embodiment.

The silicon nitride 13 is utilized as an etching resistive mask when device isolation trenches are formed in the silicon substrate 11. Lithography step and RIE (Reactive Ion Etching) are applied for selective etching of the silicon nitride 13 and oxide 12 to form a mask opening 14 as shown in FIG. 2. RIE is applied in this state for etching the silicon substrate 11 to form a device isolation trench 15 as shown in FIG. 3.

Figure 4:
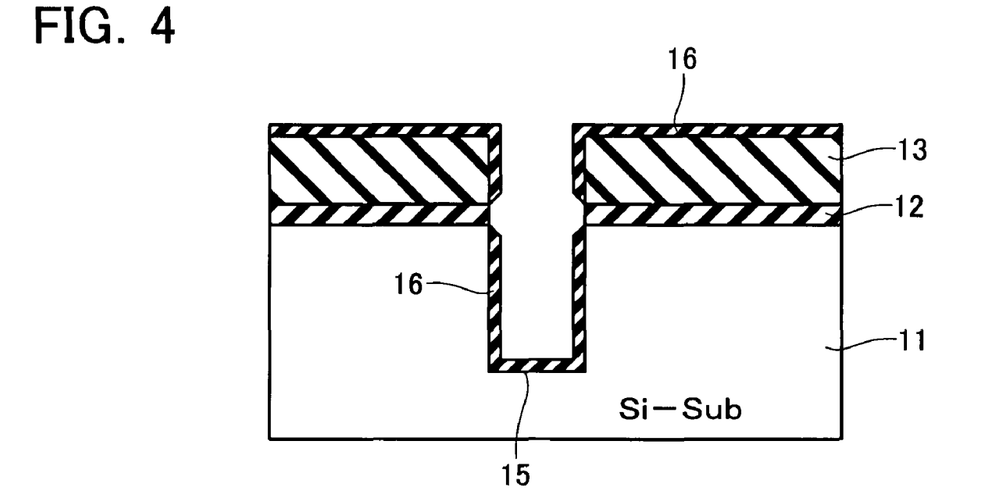
FIG. 4 is a cross-sectional view showing the step of forming a film of silicon oxide in the device isolation trench and on the silicon nitride in the same embodiment.

Thereafter, thermal oxidation is performed to form a film of silicon oxide 16 on the inner surface of the device isolation trench 15 as shown in FIG. 4. Preferably, the silicon oxide 16 is also formed over the surface of the silicon nitride 13. For that purpose, radical oxidation is utilized in the present embodiment. The aim of formation of the silicon oxide 16 even over the surface of the silicon nitride 13 is to prevent the silicon nitride from directly contacting with a film of silazane perhydride polymer to be formed later.

Figure 5:
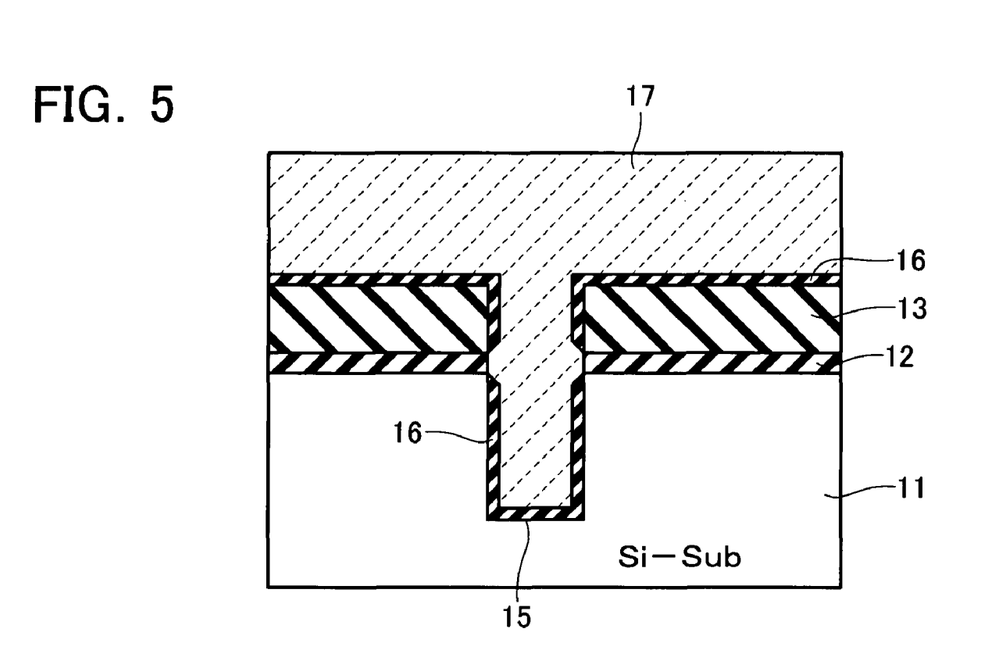
FIG. 5 is a cross-sectional view showing the step of coating a silazane perhydride polymer solution in the same embodiment.
Figure 6:
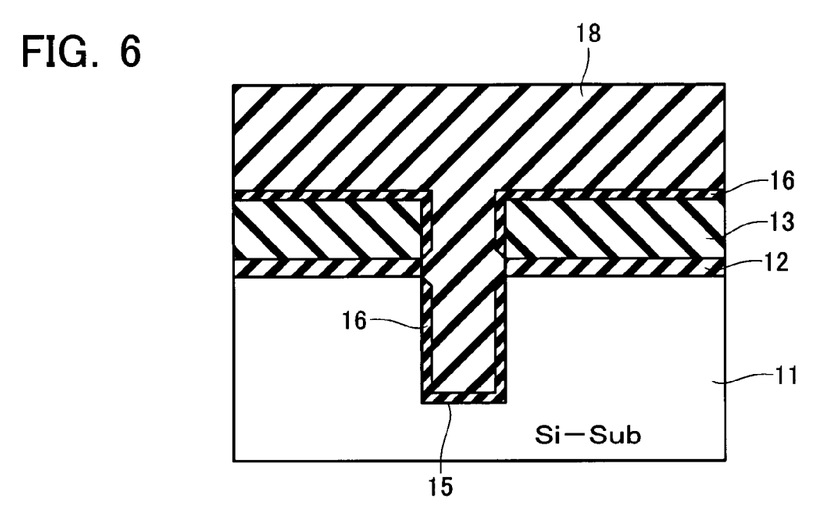
FIG. 6 is a cross-sectional view showing the chemical reaction step of the silazane perhydride polymer solution in the same embodiment.

A solution of silazane perhydride polymer 17 is coated over the substrate by spin coating as shown in FIG. 5. The silazane perhydride polymer solution 17 is subjected to heating in an inert gas ambient to vaporize a solvent contained therein. It is further subjected to heating in an oxidizing ambient such as water vapor for chemically reacting the silazane perhydride polymer to modify it into a silicon oxide 18 as shown in FIG. 6.

Figure 7:
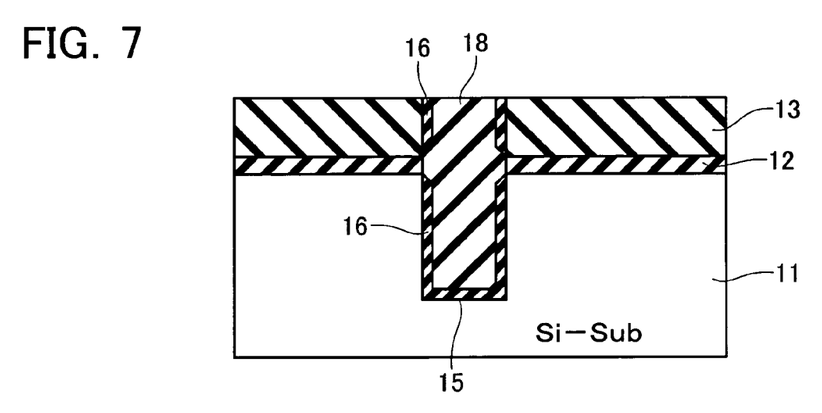
FIG. 7 is a cross-sectional view showing the CMP process and the densification step in the same embodiment.

The silicon oxide 18 thus formed is buried in the device isolation trench 15 as shown in FIG. 7, removing undesired portions therefrom using CMP prior to heating for densification. The silicon oxide 18 buried only in the device isolation trench 15 is then subjected to heating for densification. Preferably, the heating for densification is performed in an inert ambient at 900–1100° C.

Figure 8:
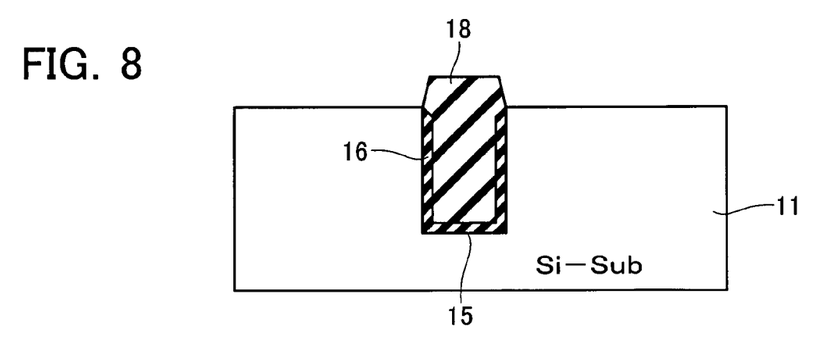
FIG. 8 is a cross-sectional view showing the step of wet etching the silicon nitride and oxide in the same embodiment.

A phosphorous acid is employed to remove the silicon nitride 13 by wet etching and a buffer hydrofluoric acid is employed to remove the silicon oxide 12 by wet etching as shown in FIG. 8.

According to the present embodiment, independent of the width of the device isolation trench, the device isolation insulator can be buried with a uniform height. This reason is given below. As shown in FIG. 6, if densification is performed prior to CMP while the silicon oxide 18 covers the whole substrate thickly, the etching rate can not be reduced sufficiently at a portion where the device isolation trench is narrow in width. To the contrary, in the present embodiment as shown in FIG. 7, undesired portions of the silicon oxide 18 on the substrate are removed through CMP process followed by densification of the silicon oxide 18. As a result, the etching rate can be reduced sufficiently even at a portion where the device isolation trench is narrow in width.

Figure 9:
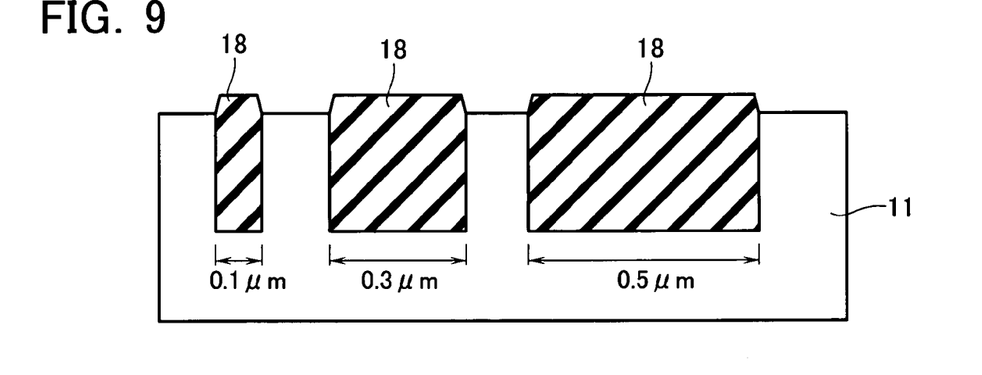
FIG. 9 is a cross-sectional view showing the silicon oxide buried in device isolation trenches with different widths in the same embodiment.

FIG. 9 shows the silicon oxide 18 buried with a substantially uniform height in device isolation trenches with different widths according to the present embodiment in comparison with FIG. 15. In the present embodiment, the silicon oxide 16 covers the surface of the silicon nitride 13 to prevent the silazane perhydride polymer solution from directly contacting the silicon nitride 13. As a result, different from the prior art, it is possible to reliably prevent the portion contacting the silicon nitride from having a high etching rate and shape deterioration occurring at the portion.

Second Embodiment

Figure 10:
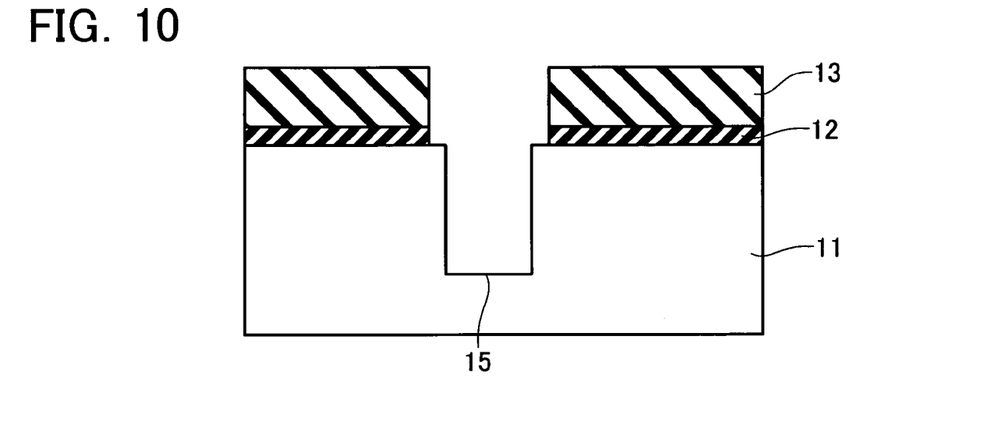
FIG. 10 is a cross-sectional view showing the step of etching a film of silicon nitride after formation of a device isolation trench according to another embodiment.

Another embodiment is described with reference to FIGS. 10–13. The steps of FIGS. 1–3 shown in the preceding embodiment are performed similarly. After the device isolation trench 5 is formed, as shown in FIG. 10 in the present embodiment, the silicon oxide 13 is subjected to wet etching to etch back opening edges slightly. The same steps as those in the preceding embodiment are then performed.

Figure 11:
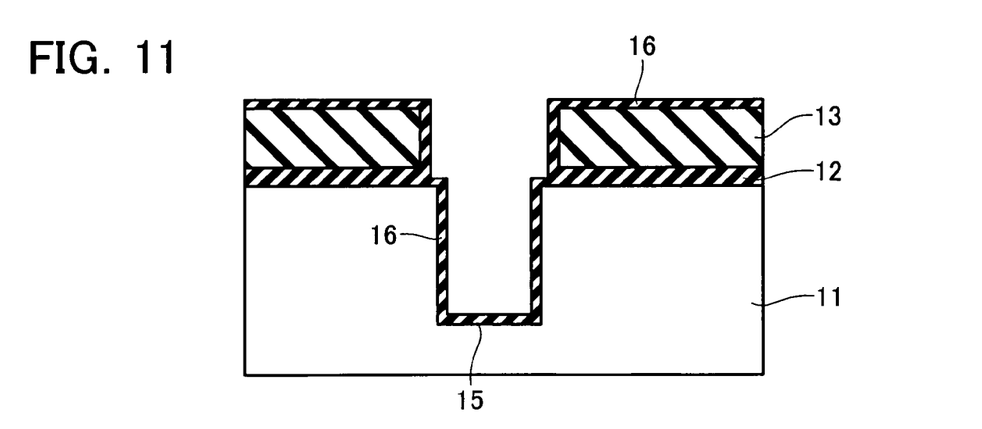
FIG. 11 is a cross-sectional view showing the step of forming a film of silicon oxide in the device isolation trench and on the silicon nitride in the same embodiment.
Figure 12:
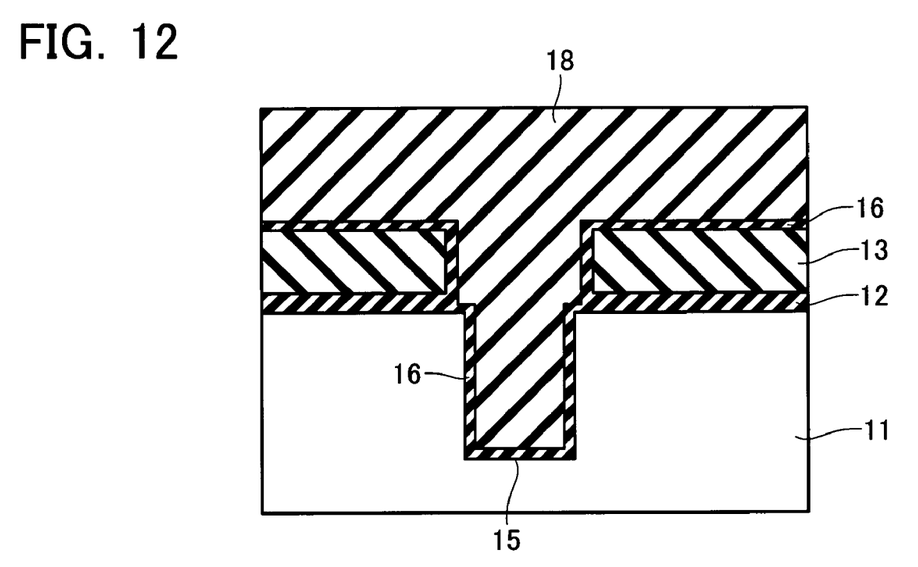
FIG. 12 is a cross-sectional view showing the step of forming a film of silicon oxide using the silazane perhydride polymer solution in the same embodiment.

More specifically, as shown in FIG. 11, a film of silicon oxide 16 is formed on the inner surface of the device isolation trench 15 and the surface of the silicon nitride 13. The solution of silazane perhydride polymer is coated over them and modified into the silicon oxide 18 through chemical reaction during heating in a water vapor ambient as shown in FIG. 12.

Figure 13:
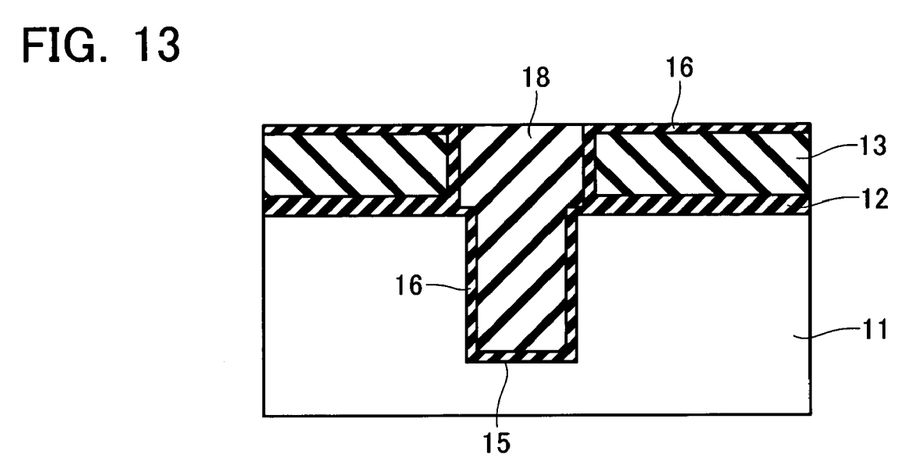
FIG. 13 is a cross-sectional view showing the CMP process and the densification step in the same embodiment.

Further, CMP process is performed to planarize the silicon oxide 18 and making a residue in the device isolation trench 15 as shown in FIG. 13 followed by heating for densification.

Figure 16:
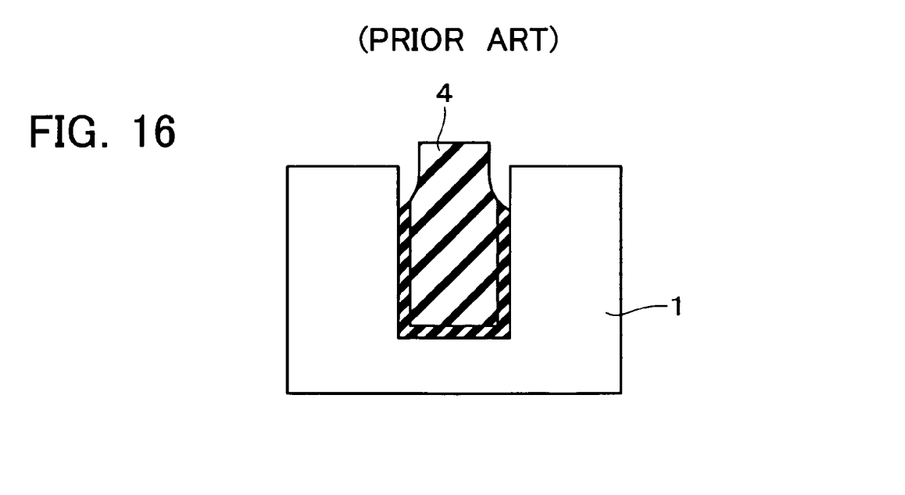
FIG. 16 is a cross-sectional view showing shape deterioration of the device isolation insulator formed by the conventional method.

According to the present embodiment, the same effect as that by the preceding embodiment can be obtained. In addition, it is possible to avoid the disadvantage that is caused when the edge of the silicon oxide 18 buried in the device isolation trench 15 is etched in a later wet etching step. In the step of wet etching the silicon nitride 13 and oxide 12, the device isolation insulator or the silicon oxide 18 is inevitably etched back to some extent. FIG. 16 shows that a deep recess is formed in the boundary of the device isolation region when the edge of the silicon oxide 4 buried by the conventional method is greatly etched. This recess causes leakage and short-circuits in the device to be produced later. In the present embodiment, the silicon oxide 18 covers a wider range than the device isolation trench 15. Therefore, such the state as shown in FIG. 16 can not be invited and the device isolation trench 15 can be filled with the silicon oxide 18 reliably.

Third Embodiment

Figure 14:
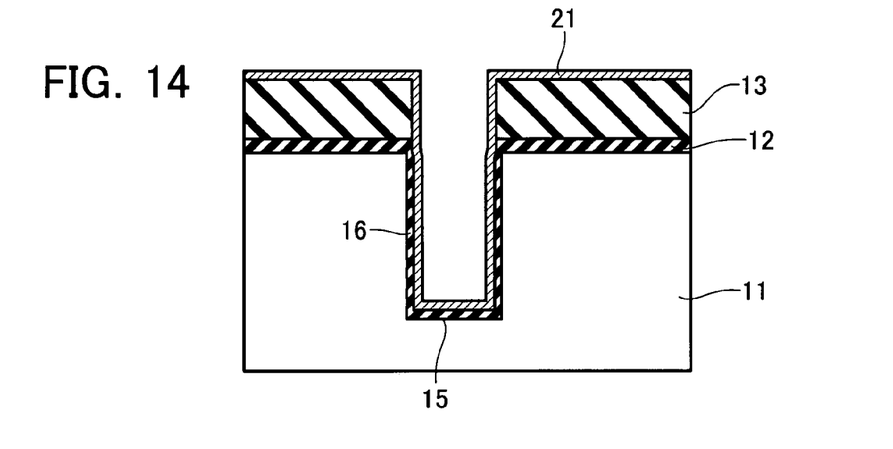
FIG. 14 is a cross-sectional view showing the step of forming a film of silicon oxide on a film of silicon nitride according to a further embodiment.

In the above embodiment, radical oxidation is employed as the method of forming the silicon oxide 16 on the silicon nitride 13. Alternatively, low pressure CVD or plasma CVD may be employed to deposit a film of silicon oxide 21 thinly, as shown in FIG. 14, on the inner surface of the device isolation trench 15 and the surface of the silicon nitride 13. Also in this case, it is preferable to form the silicon oxide 16 on the surface of the device isolation trench 15 previously by thermal oxidation.

According to the embodiments described above, when a device isolation trench is filled with a silazane perhydride polymer solution, densification of a silicon oxide to be formed is performed after removal of undesired portions. Therefore, it is possible to bury the silicon oxide without shape deterioration.

Having described the embodiments consistent with the invention, other embodiments and variations consistent with the invention will be apparent to those skilled in the art. Therefore, the invention should not be viewed as limited to the disclosed embodiments but rather should be viewed as limited only by the spirit and scope of the appended claims.

What is claimed is:

1. A method of producing semiconductor devices, comprising the steps of:
   forming an etching resistive mask over a semiconductor substrate;
   etching said semiconductor substrate through an opening in said etching resistive mask to form a device isolation trench;
   forming a silicon oxide layer over the etching resistive mask and the semiconductor substrate having said device isolation trench formed therein;
   forming a coat of a silazane perhydride polymer solution over the silicon oxide layer;
   vaporizing a solvent from said coat and then subjecting said coat to chemical reaction to form a silicon oxide film;
   removing said film of the silicon oxide remaining inside said device isolation trench; by performing a chemical mechanical polishing (CMP) process; and
   after removing said film, heating said residue to remove impurities for densification.

2. The method according to claim 1, wherein said etching resistive mask is formed so as to contain a film of silicon nitride, further comprising the step of:
   forming the film of silicon oxide over the surface of said silicon nitride after formation of said device isolation trench and before forming said coat of said silazane perhydride polymer solution.

3. The method according to claim 1, wherein said etching resistive mask is formed so as to contain a film of silicon nitride, further comprising the step of:
   forming the film of silicon oxide over the surface of said silicon nitride after formation of said device isolation trench, before forming said coat of said silazane perhydride polymer solution and after etching said silicon nitride to etch back opening edges.

4. The method according to claim 2 or 3, wherein said step of forming said silicon oxide over the surface of said silicon nitride includes either one of radical oxidation, low pressure CVD and plasma CVD.

* * * * *

UNITED STATES PATENT AND TRADEMARK OFFICE
CERTIFICATE OF CORRECTION

| | | |
|---|---|---|
| PATENT NO. | : 7,214,595 B2 | Page 1 of 1 |
| APPLICATION NO. | : 10/607216 | |
| DATED | : May 8, 2007 | |
| INVENTOR(S) | : Kawasaki et al. | |

It is certified that error appears in the above-identified patent and that said Letters Patent is hereby corrected as shown below:

Claim 1, column 6, line 17, change "removing said film of the silicon oxide remaining inside" to --removing said film, except for residue of silicon oxide remaining inside--.

Claim 1, column 6, line 18, change "trench;" to --trench,--.

Signed and Sealed this

Thirty-first Day of July, 2007

JON W. DUDAS
*Director of the United States Patent and Trademark Office*